(12) United States Patent
Ikeda (10) Patent No.: US 7,803,470 B2
(45) Date of Patent: Sep. 28, 2010

(54) HIGH-FREQUENCY MAGNETIC THIN FILM AND HIGH-FREQUENCY ELECTRONIC DEVICE

(75) Inventor: Kenji Ikeda, Gunma (JP)

(73) Assignee: Taiyo Yuden Co.,Ltd., Tokyo (JP)

( * ) Notice: Subject to any disclaimer, the term of this patent is extended or adjusted under 35 U.S.C. 154(b) by 0 days.

(21) Appl. No.: 11/724,458

(22) Filed: Mar. 14, 2007

(65) Prior Publication Data

US 2007/0218273 A1  Sep. 20, 2007

(30) Foreign Application Priority Data

Mar. 15, 2006  (JP)  ............................. 2006-110238

(51) Int. Cl.
G11B 5/64  (2006.01)
(52) U.S. Cl. ........................ 428/826; 428/827; 428/828; 428/829
(58) Field of Classification Search ................. 428/826
See application file for complete search history.

(56) References Cited

U.S. PATENT DOCUMENTS

| | | | |
|---|---|---|---|
| 5,695,864 A * | 12/1997 | Slonczewski | ............... 428/212 |
| 5,789,069 A | 8/1998 | Araki et al. | |
| 6,313,973 B1 * | 11/2001 | Fuke et al. | ............... 360/324.1 |
| 6,455,174 B1 * | 9/2002 | Takao et al. | .................. 428/632 |
| 6,713,195 B2 * | 3/2004 | Wang et al. | ............... 428/811.2 |
| 6,731,446 B2 * | 5/2004 | Ikeda et al. | .................... 360/59 |
| 6,744,583 B2 * | 6/2004 | Ikeda et al. | .................... 360/59 |
| 6,759,148 B2 * | 7/2004 | Tanahashi et al. | ............ 428/828 |
| 6,781,779 B2 * | 8/2004 | Arita et al. | .................... 360/59 |
| 6,816,330 B2 * | 11/2004 | Ikeda et al. | .................... 360/59 |
| 6,835,475 B2 * | 12/2004 | Carey et al. | .............. 428/828.1 |
| 6,862,159 B2 * | 3/2005 | Hasegawa | .............. 360/324.11 |
| 6,950,261 B2 * | 9/2005 | Seo et al. | ...................... 360/59 |
| 7,110,327 B2 * | 9/2006 | Takao et al. | ............... 369/13.14 |
| 2001/0048568 A1 * | 12/2001 | Ikeda et al. | .................... 360/59 |
| 2001/0051287 A1 * | 12/2001 | Kikitsu et al. | ......... 428/694 ML |
| 2002/0027732 A1 * | 3/2002 | Arita et al. | .................... 360/59 |

(Continued)

FOREIGN PATENT DOCUMENTS

EP  1 450 378 A2  8/2004

(Continued)

OTHER PUBLICATIONS

"Large Negative Magnetic Anisotropy in Epitaxially Grown Fe/Co Multilayer Films," Okamoto et al., J. Magn. Soc. Jpn., 33, 451-454 (2009).

(Continued)

Primary Examiner—Mark Ruthkosky
Assistant Examiner—Gary Harris
(74) Attorney, Agent, or Firm—Law Office of Katsuhiro Arai (57) ABSTRACT

One inventive aspect relates to a high-frequency magnetic thin film capable of working in a GHz-level band, and an electronic device comprising the film. The film comprises a magnetic layer and an insulating layer that are laminated alternately. The magnetic layer includes a first magnetic layer and a second magnetic layer. The first magnetic layer has a higher anisotropic magnetic field than the second magnetic layer, and the second magnetic layer has a higher saturation magnetization than the first magnetic layer.

23 Claims, 7 Drawing Sheets

U.S. PATENT DOCUMENTS

| | | | |
|---|---|---|---|
| 2002/0097640 A1* | 7/2002 | Seo et al. | 369/13.24 |
| 2002/0118477 A1* | 8/2002 | Ikeda et al. | 360/55 |
| 2002/0146580 A1* | 10/2002 | Wang et al. | 428/469 |
| 2002/0181337 A1* | 12/2002 | Takao et al. | 369/13.14 |
| 2003/0017364 A1* | 1/2003 | Kikitsu et al. | 428/693 |
| 2003/0022023 A1* | 1/2003 | Carey et al. | 428/694 MM |
| 2003/0035235 A1* | 2/2003 | Ikeda et al. | 360/59 |
| 2003/0189878 A1* | 10/2003 | Miyakoshi | 369/13.45 |
| 2003/0203243 A1* | 10/2003 | Shiratori et al. | 428/694 ML |
| 2003/0214742 A1* | 11/2003 | Kai et al. | 360/46 |
| 2004/0053078 A1* | 3/2004 | Kikitsu et al. | 428/694 TM |
| 2004/0070890 A1* | 4/2004 | Fullerton et al. | 360/324.2 |
| 2004/0209098 A1* | 10/2004 | Kobayashi et al. | 428/493 |
| 2004/0209111 A1* | 10/2004 | Kobayashi et al. | 428/632 |
| 2005/0083598 A1* | 4/2005 | Seo et al. | 360/59 |
| 2005/0207073 A1* | 9/2005 | Carey et al. | 360/324.12 |
| 2006/0153976 A1* | 7/2006 | Ito et al. | 427/127 |
| 2006/0255383 A1* | 11/2006 | Kaiser et al. | 257/295 |
| 2007/0096229 A1* | 5/2007 | Yoshikawa et al. | 257/421 |
| 2008/0206891 A1 | 8/2008 | Wang et al. | |

FOREIGN PATENT DOCUMENTS

| | | |
|---|---|---|
| EP | 1450378 A2 * | 8/2004 |
| JP | 9-63844 | 3/1997 |
| JP | 2003-338409 | 11/2003 |

OTHER PUBLICATIONS

Ferromagnetism, Sixth Printing, R. M. Bozorth, p. 165 and p. 183 (1961).

* cited by examiner

HIGH-FREQUENCY MAGNETIC THIN FILM AND HIGH-FREQUENCY ELECTRONIC DEVICE

BACKGROUND OF THE INVENTION

1. Field of the Invention

The present invention relates to a magnetic thin film capable of working in a GHz-order frequency band, and to an electronic device comprising it.

2. Description of the Related Technology

With rapid popularization of mobile communication with typically mobile phones, a demand for communication appliances having a high transmission speed is increasing. A novel standard made for increasing the transmission speed of such mobile communication appliances is toward the increase in the working frequency thereof for avoiding a competition with the already-existing electric wave communications technology, and recently, the working frequency of mobile communication appliances has reached a GHz-order level. Accordingly, workability in a GHz band is one indispensable matter for the material to be used for the devices that meet the recent communication standard.

The workability in such a high frequency band is required also for other electronic devices comprising a magnetic material, such as inductor, transformer, etc. However, since a magnetic material increases its loss through ferromagnetic resonance, the devices comprising it are difficult to work in a high-frequency band. For realizing the reduction in the loss of magnetic material in a high-frequency band, it is desirable to increase the saturation magnetization of the material and the anisotropic magnetic field around it to thereby increase the resonance frequency of the material. For obtaining a magnetic material having the characteristics, proposed is a magnetic thin film of a thin magnetic layer and a thin insulating layer alternately laminated on each other. See JP-A-9-063844: JP-A-9-063844 and JP-A-2003-338409.

It is known that the resonance frequency of a magnetic thin film depends on the product of the saturation magnetization and the anisotropic magnetic field thereof, as in the following equation 1 wherein fr indicates the resonance frequency, Ms indicates the saturation magnetization, and Hk indicates the anisotropic magnetic field.

$$fr = \frac{\gamma}{2\pi}\sqrt{Hk \cdot Ms} \qquad \text{Equation 1}$$

(In this, $\gamma$ indicates a gyro magnetic constant.)

A magnetic material has an almost constant saturation magnetization value, and therefore, it has heretofore been considered that the method of increasing the resonance frequency of the material could be attained by actually increasing the anisotropic magnetic filed to thereby increase the magnetization rotation of the material. For the method of increasing the anisotropic magnetic field of a magnetic material, known are (1) thermal treatment of the material in a magnetic film to thereby impart induced magnetic anisotropy thereto, (2) forming a slit through a magnetic thin film to thereby impart profile magnetic anisotropy thereto, and (3) exchange coupling between a ferromagnetic film and an antiferromagnetic film. However, the above are problematic in that the process (1) is complicated as requiring thermal treatment, the process (2) results in substantial reduction in the magnetic permeability of the slit-formed magnetic thin film since the magnetic permeability of the slit part of the film is lost, and the process (3) results in the reduction in the magnetic permeability of the laminate structure since the antiferromagnetic film is formed and the saturation magnetization of the overall magnetic film laminate is thereby lowered.

Figure 14:
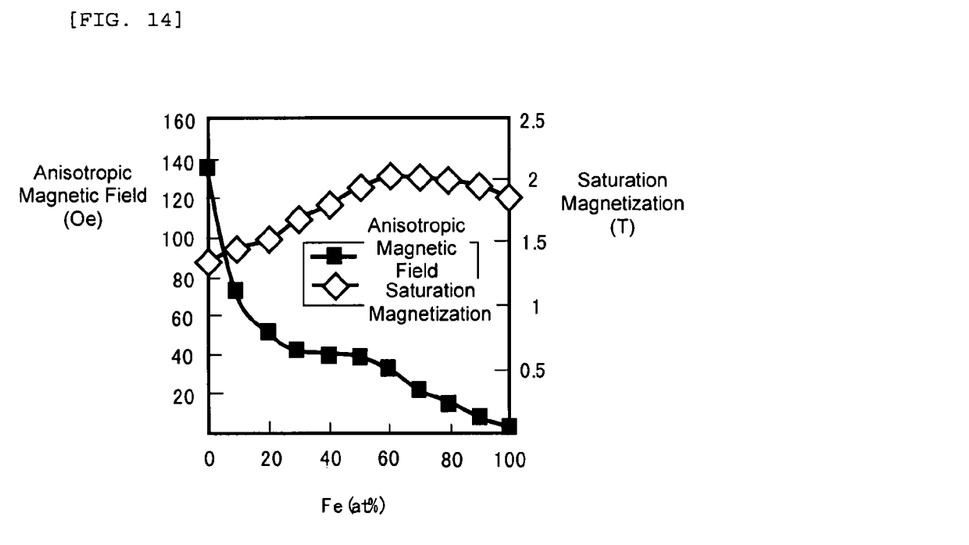
FIG. 14 is a graph showing the relationship between the saturation magnetization and the anisotropic magnetic field of a FeCo alloy magnetic material.

FIG. 14 is a graph showing the change of the saturation magnetization and the anisotropic magnetic field of a FeCo alloy magnetic material, depending on the Fe proportion in the alloy. From this, it is known that the increase in the saturation magnetization tends to the reduction in the anisotropic magnetic field. As in this, the alloy could hardly satisfy both a high saturation magnetization and a high anisotropic magnetic field, and therefore it is difficult for one and the same kind of a magnetic material to satisfy both a high saturation magnetization and a high anisotropic magnetic field, therefore attaining a reduced loss and an increased resonance frequency in a high-frequency band. In particular, it is extremely difficult to realize the characteristics necessary for obtaining electronic devices that may work in a GHz-level band.

SUMMARY OF CERTAIN INVENTIVE ASPECTS

Certain inventive aspects relate to providing a magnetic thin film having a high saturation magnetization and a high anisotropic magnetic field and to providing an electronic device capable of effectively working in a GHz-level band.

One inventive aspect proposes a high-frequency magnetic thin film comprising a magnetic layer and an insulating layer that are laminated alternately, wherein the magnetic layer includes a first magnetic layer and a second magnetic layer, the first magnetic layer has a higher anisotropic magnetic field than the second magnetic layer, and the second magnetic layer has a higher saturation magnetization than the first magnetic layer.

According to one inventive aspect, a first magnetic layer and a second magnetic layer are laminated whereby the anisotropic magnetic field of the first magnetic layer may be increased up to the extremity and the saturation magnetization of the second magnetic layer may be increased up to the extremity with the result that the saturation magnetization of the second magnetic layer may compensate for that of the first magnetic layer and the anisotropic magnetic field of the first magnetic layer may compensate for that of the second magnetic layer. The respective magnetic layers are separated from each other by the insulating layer put therebetween, and are thus alternately laminated, and accordingly, the magnetic materials of the two layers do not mix and the two layers may fully express their own excellent characteristics. As a result, the resonance frequency of the magnetic thin film may be increased.

One inventive aspect also proposes a high-frequency magnetic thin film wherein the first magnetic layer comprises essentially an alloy of a rare earth metal and a ferromagnetic 3d transition metal; and a high-frequency magnetic thin film wherein the second magnetic layer comprises essentially a ferromagnetic 3d transition metal or its alloy. One inventive aspect also proposes a high-frequency magnetic thin film wherein the rare earth metal is Sm; and a high-frequency magnetic thin film wherein the 3d transition metal is Co.

According to one inventive aspect, the first magnetic layer may comprise essentially an alloy of a 3d transition metal (e.g., one of Fe, Co and Ni) and a rare earth metal (e.g., one of Sm, Pr, Ce, Y, Nd and La), and therefore the magnetic layer may have a higher anisotropic magnetic field (for example at least about 1000 Oe) than an ordinary anisotropic magnetic field (for example approximately from 100 to 150 Oe). The second magnetic layer may comprise essentially a ferromagnetic 3d transition metal or its alloy, and therefore the saturation magnetization of the magnetic layer may be high. When the rare earth metal is Sm and the 3d transition metal is Co therein, then the anisotropic magnetic field of the magnetic layer may be the highest.

One inventive aspect also proposes a high-frequency magnetic thin film wherein the first magnetic layer or the second magnetic layer has a granular structure of a magnetic particle enveloped with an insulating material.

According to one inventive aspect, the magnetic layer may have a granular structure as above, whereby the insulation resistance of the magnetic thin film may be increased and the eddy-current loss in the high-frequency magnetic permeability characteristics of the film may be greatly reduced.

One inventive aspect also proposes a high-frequency magnetic thin film wherein the first magnetic layer and the second magnetic layer are coupled in a mode of exchange coupling with each other via the insulating layer given therebetween. One inventive aspect also proposes a high-frequency magnetic thin film wherein the first magnetic layer and the second magnetic layer are regularly laminated via the insulating layer given therebetween.

According to one inventive aspect, the first magnetic layer and the second magnetic layer are coupled in a mode of exchange coupling with each other at their interfaces via the insulating layer given therebetween, whereby the anisotropic magnetic field of the respective layers is averaged. The first magnetic layer and the second magnetic layer are regularly laminated at a predetermined ratio and therefore, the proportion of the respective layers and the thickness thereof may be controlled. Accordingly, the saturation magnetization and the anisotropic magnetic field of the film may be change in a broad range, and the magnetic permeability and the resonance frequency thereof may be controlled within a predetermined range. "Exchange coupling" as referred to herein is defined as a condition of exchange interaction between different magnetic layers.

One inventive aspect also proposes a high-frequency electronic device comprising a magnetic thin film and a conductor of a conductive metal, wherein the magnetic thin film comprises an insulating layer and a magnetic layer that are laminated alternately, the magnetic layer includes a first magnetic layer and a second magnetic layer, the first magnetic layer has a higher anisotropic magnetic field than the second magnetic layer, the second magnetic layer has a higher saturation magnetization than the first magnetic layer, and the conductor having a predetermined shape is formed on the magnetic thin film.

According to one inventive aspect, an electronic device with little loss can be obtained that can work in a GHz-level band.

As in the above, certain inventive aspects have realized a magnetic thin film having a high saturation magnetization and a high anisotropic magnetic field as compared with conventional magnetic thin films, and having a reduced loss and an increased resonance frequency in a high-frequency zone, and have also realized an electronic device capable of working in a GHz-level band.

In these drawings, 1 is a first magnetic layer, 2 is a second magnetic layer, 3 is an insulating layer, 4 is a magnetic particle, 5 is an insulator, 6 is a substrate, 7 is a magnetic thin film, 8 is a conductor.

DESCRIPTION OF CERTAIN ILLUSTRATIVE EMBODIMENTS

Various aspects and features of the invention will become more fully apparent from the following description and appended claims taken in conjunction with the foregoing drawings. In the drawings, like reference numerals indicate identical or functionally similar elements. In the following description, specific details are given to provide a thorough understanding of the disclosed methods and apparatus. However, it will be understood by one of ordinary skill in the technology that the disclosed systems and methods may be practiced without these specific details.

Figure 1:
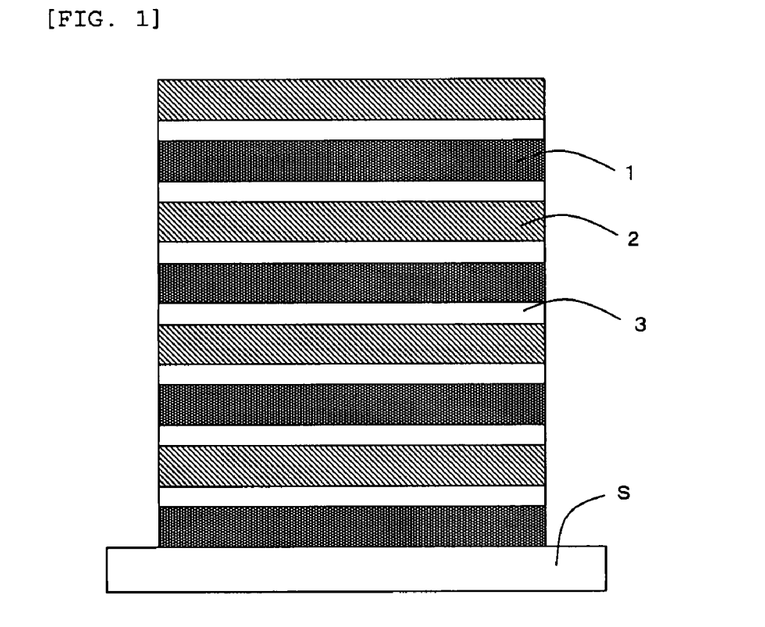
FIG. 1 is a schematic view showing the cross section of a magnetic thin film of a first embodiment of the invention.

The first embodiment of the high-frequency magnetic thin film is described with reference to its drawings. FIG. 1 is a schematic view showing the cross section of a magnetic thin film of the first embodiment of the invention, in which the ratio of first magnetic layer/second magnetic layer is 1/1. In the magnetic thin film, a first magnetic layer 1 and a second magnetic layer 2 are alternatively laminated via an insulating layer 3 given therebetween. The first magnetic layer is so planned as to have a higher anisotropic magnetic field than the second magnetic layer 2, while on the other hand, the second magnetic layer 2 is so planned as to have a higher saturation magnetization than the first magnetic layer 1. The magnetic material to be used for the first magnetic layer 1 is preferably a magnetic material having a high anisotropic magnetic field, including, for example, a Co—Sm alloy, a 3d transition metal/rare earth metal alloy such as Co—Y, Co—Ce, Co—Pr, Co—La, Co—Nd, and a regular alloy such as Fe—Pt or Co—Pt. The magnetic material to be used for the second magnetic layer 2 is preferably Co, Fe, and a 3d transition metal alloy including, for example, an Fe—Co alloy, an Fe—Ni alloy and a Co—Ni alloy. The insulating material to be used in the insulating layer 3 includes, for example, $SiO_2$, $Al_2O_3$.

One example of a production method for the magnetic film is described, having a constitution of first magnetic layer/second magnetic layer/insulating layer=Co—Sm/Co/$SiO_2$. For example, on an insulating substrate S such as Si or $Al_2O_3$, formed is a first magnetic layer 1 having a thickness of about 10 nm, using an induction-coupling RF sputtering apparatus under the following condition: (1) The atmosphere gas is Ar; (2) the pressure for film formation is about 220 mPa; (3) the back pressure is at most about $1.0 \times 10^{-5}$ Pa; and (4) the target is Co—Sm (Sm: about 17 atm %). Next, under the same condition but changing the target to $SiO_2$, an insulating layer 3 having a thickness of about 1 nm is formed on the above first magnetic layer 1. Next, also under the same condition but changing the target to Co, a second magnetic layer 2 having a thickness of about 10 nm is formed on the insulating layer 3. Further, an insulating layer 2 having a thickness of about 1 nm is formed on the above second magnetic layer 2. This is repeated to fabricate a magnetic thin film laminate.

Figure 2:
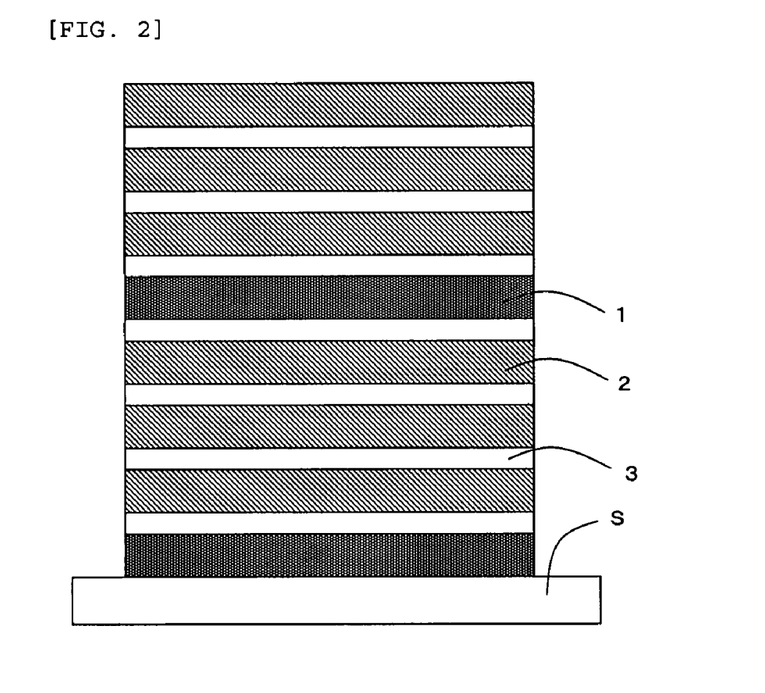
FIG. 2 is a schematic view showing the cross section of another magnetic thin film of the first embodiment of the invention.
Figure 3:
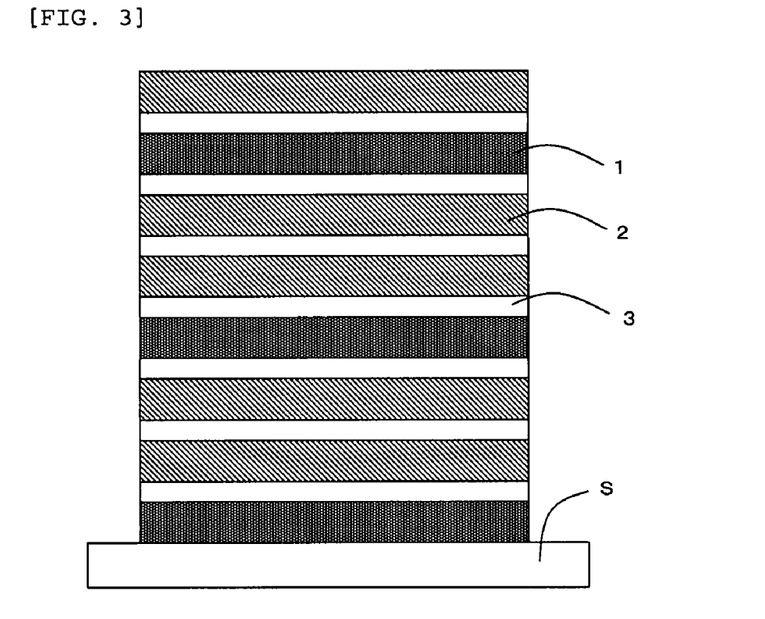
FIG. 3 is a schematic view showing the cross section of still another magnetic thin film of the first embodiment of the invention.
Figure 4:
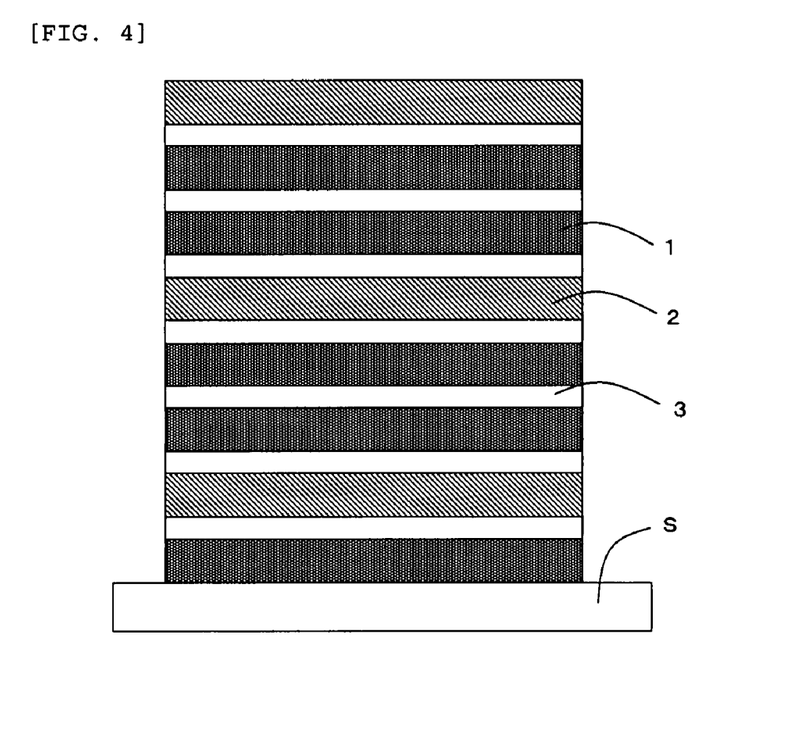
FIG. 4 is a schematic view showing the cross section of still another magnetic thin film of the first embodiment of the invention.

FIG. 2 to FIG. 4 are modifications of this embodiment. In the modification of FIG. 2, three second magnetic layers are laminated on every one first magnetic layer; in the modification of FIG. 3, two second magnetic layers are laminated on every one first magnetic layer; and in the modification of FIG. 4, one second magnetic layer is laminated on every two first magnetic layers. These modifications may be produced by suitably forming the necessary constitutive layers each under the same condition as above.

Figure 5:
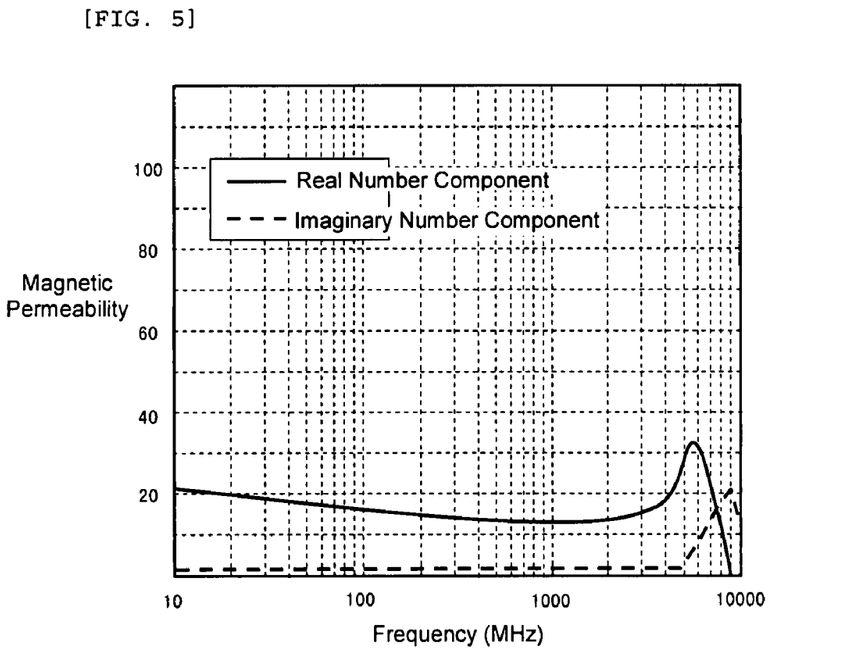
FIG. 5 is a magnetic permeability-frequency characteristic graph of the magnetic thin film of FIG. 1.
Figure 6:
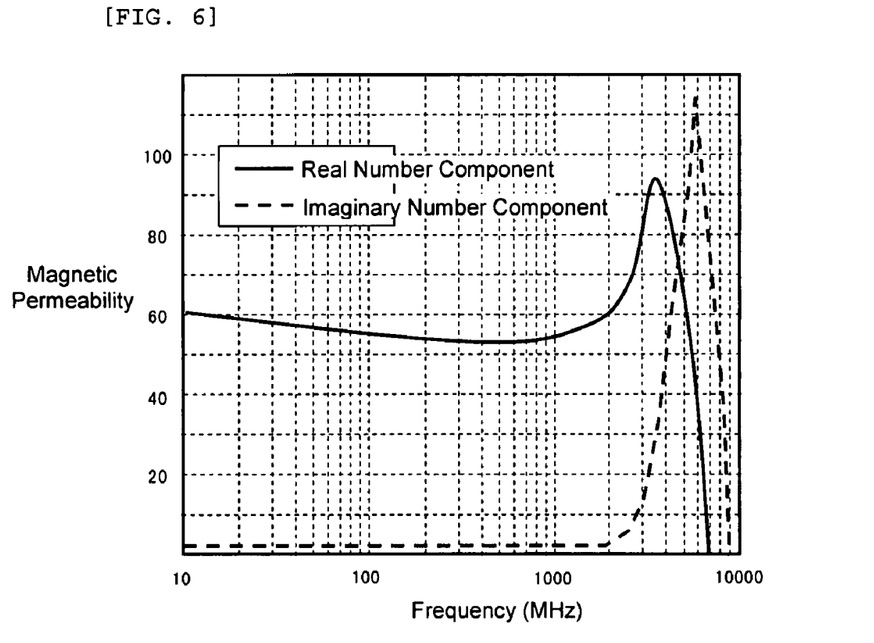
FIG. 6 is a magnetic permeability-frequency characteristic graph of the magnetic thin film of FIG. 2.
Figure 7:
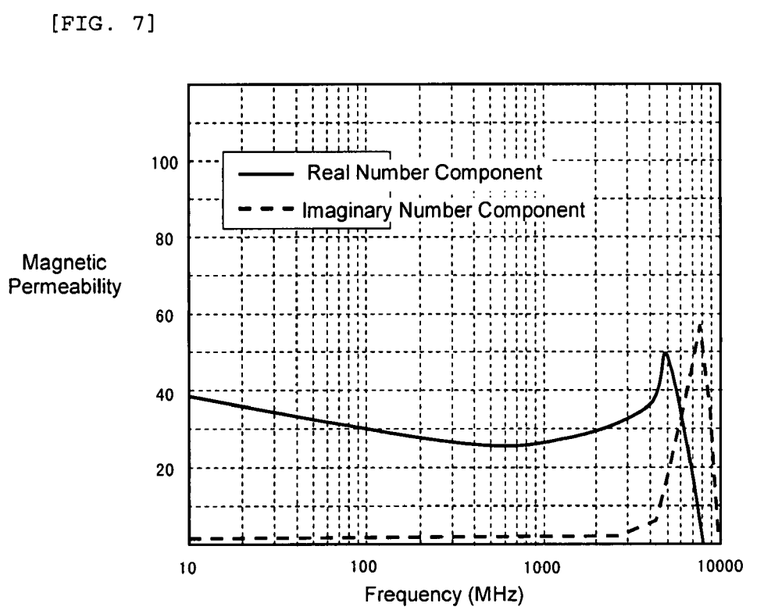
FIG. 7 is a magnetic permeability-frequency characteristic graph of the magnetic thin film of FIG. 3.
Figure 8:
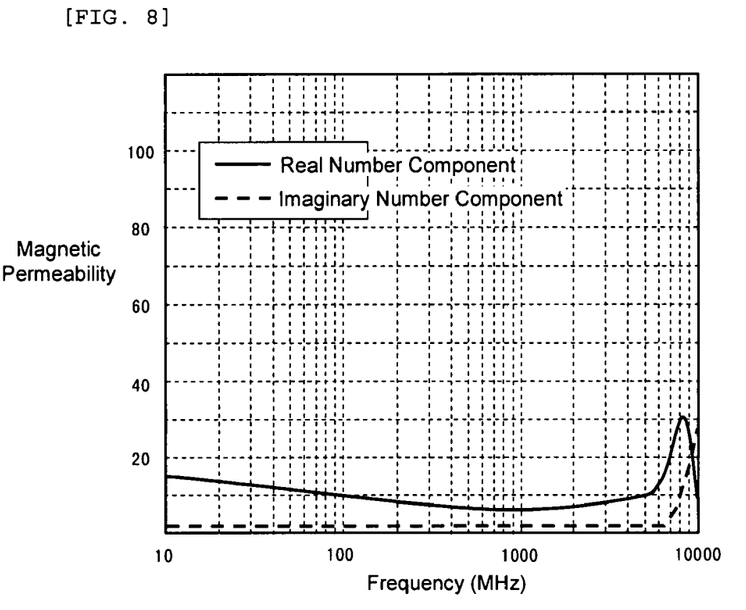
FIG. 8 is a magnetic permeability-frequency characteristic graph of the magnetic thin film of FIG. 4.

FIG. 5 to FIG. 8 are graphs showing the magnetic permeability-frequency characteristic of the magnetic thin films of FIG. 1 to FIG. 4, respectively. FIG. 5 is a graph of the magnetic thin film of FIG. 1; FIG. 6 is a graph of the magnetic thin film of FIG. 2; FIG. 7 is a graph of the magnetic thin film of FIG. 3; FIG. 8 is a graph of the magnetic thin film of FIG. 4. These show that all the magnetic thin films have a resonance frequency of at least 3 GHz. This means that the saturation magnetization and the anisotropic magnetic field of the films are increased with the result that the product of Hk and Ms in the formula (1) is on the level of a GHz band. Comparing these graphs shows that, when the proportion of the second magnetic layer 2 is larger, then the magnetic permeability is higher; but on the contrary, when the proportion of the first magnetic layer 1 is larger, then the resonance frequency is higher. This means that, when the proportion of the second magnetic layer 2 is larger, then the saturation magnetization is increased and the magnetic permeability is thereby increased, and that, when the proportion of the first magnetic layer 1 is larger, then the anisotropic magnetic field is increased and the resonance frequency is thereby increased, therefore resulting in that the second magnetic layer 2 and the first magnetic layer 1 effectively function as a high saturation magnetization layer and a high anisotropic magnetic field layer, respectively.

Figure 9:
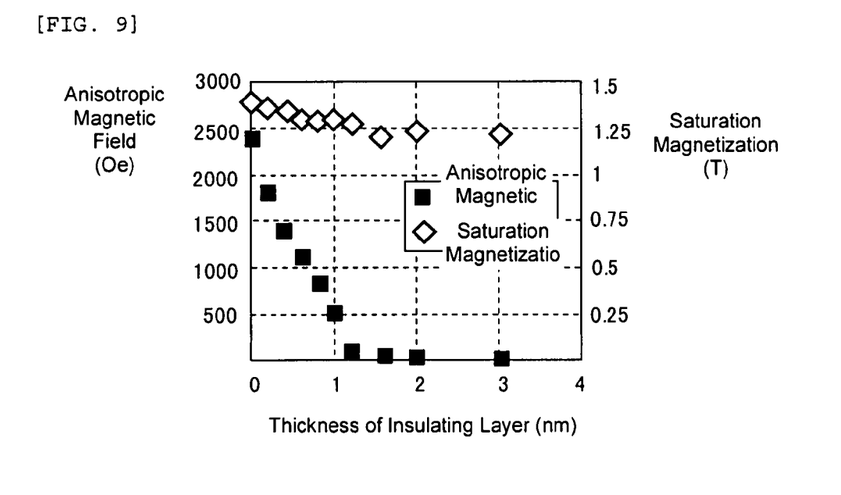
FIG. 9 is a graph showing the relationship between the thickness of an insulating layer and the saturation magnetization and the anisotropic magnetic field of the magnetic thin film having the insulating layer.

The thickness of the insulating layer 3 is described with reference to the graph of FIG. 9 that shows the relationship between the thickness of an insulating layer and the saturation magnetization and the anisotropic magnetic field of the magnetic thin film having the insulating layer. It is considered that the reduction in the anisotropic magnetic filed in accordance with the increase in the thickness of the insulating layer may be because of the sudden reduction in the exchange interaction between the first magnetic layer 1 and the second magnetic layer 2 in accordance with the increase in the thickness of the insulating layer. In particular, in the region where the thickness of the insulating layer is about 1.6 nm or more, the anisotropic magnetic field is almost at a constant value of about 20 Oe or so. The value of the anisotropic magnetic field is nearly the same as the anisotropic magnetic field of a magnetic thin film formed of the second magnetic layer alone, and it may be presumed that this would be in a condition where the exchange interaction with the first magnetic layer 1 has almost disappeared. Accordingly, in these samples, it may be considered that the first magnetic layer 1 and the second magnetic layer 2 would almost independently work, and it may be presumed that the magnetization of the first magnetic layer having a high anisotropic magnetic layer would be almost inactive and that the magnetization movement of the second magnetic layer 2 alone may be observed. For obtaining a high anisotropic magnetic field necessary for improving the high-frequency magnetic characteristics of a high-frequency magnetic film, the high saturation magnetization layer and the high anisotropic magnetic field layer in the film must be coupled in a mode of exchange coupling therein, and therefore it is desirable that the thickness of the insulating layer 3 is at most 1 nm. Even when the thickness of the insulating layer 3 is 0, the magnetic film may show an anisotropic magnetic field over about 2000 Oe just after its fabrication, but after aging with time or through thermal treatment, the characteristics of the magnetic material in the constitutive layers may worsen. Accordingly, the thickness of the insulating layer 3 is preferably at least about 0.2 nm.

Figure 10:
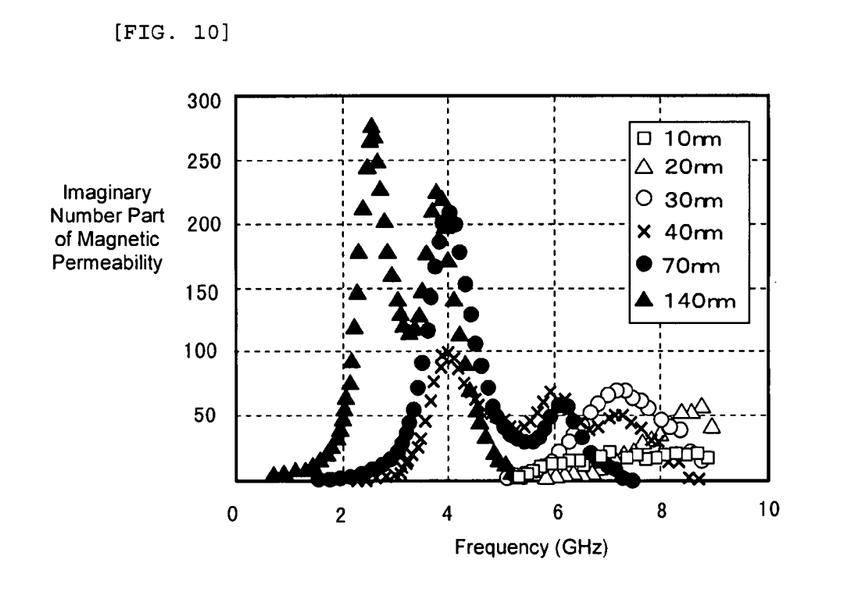
FIG. 10 is a graph showing the relationship between the thickness of the first magnetic layer and the imaginary number part of the magnetic permeability of the magnetic thin film having the first magnetic layer.

The thickness of the magnetic layer is described with reference to FIG. 10. FIG. 10 is a graph showing the relationship between the thickness of the first magnetic layer 1 that is changed to 10 nm, 20 nm, 30 nm, 40 nm, 70 nm and 140 nm, and the imaginary number part of the magnetic permeability of the magnetic thin film having the first magnetic layer. The samples are as follows: The first magnetic layers 1 each having the predetermined thickness are alternately laminated with the second magnetic layers 2 each having a thickness of 10 nm, the number of which is determined in accordance with the number of the first magnetic layers 1 so that the ratio of the first magnetic layers 1 to the second magnetic layers 2 could be 1/1, with inserting an insulating layer 3 having a thickness of 0.6 nm between the every two magnetic layers 1 and 2.

The graph shows that the imaginary number component of the magnetic permeability forms a peak on the higher frequency side in the samples where the first magnetic layer 1 is thinner, but that the peak of the imaginary number component the magnetic permeability of the samples where the first magnetic layer 1 is thick is shifted to the low frequency side. In particular, it is seen that the samples where the thickness of the first magnetic layer 1 is about 40 nm or more have plural peaks of the imaginary number component of the magnetic permeability thereof. The reason why the samples have such plural peaks may be because of the existence of plural resonance modes inside the magnetic layers therein. It may be considered that the existence of such plural modes may be because of the following reasons: When the first magnetic layer 1 is thick, then there may exist a part adjacent to the second magnetic layer 2 and a part not adjacent to the second magnetic layer 2, thereby forming phases having a partially different anisotropic magnetic field, or the thick first magnetic layer 1 may have an anisotropic magnetic field distribution inside it of such that the anisotropic magnetic field of the interface region of the first magnetic layer 1 near to the second magnetic layer 2 differs from that of the inside region of the first magnetic layer 1 remote from the second magnetic layer 2. For effectively increasing the anisotropic magnetic field of the thin magnetic film and for thereby making the film have improved high-frequency magnetic characteristics, it is desirable that the thickness of the high anisotropic magnetic field layer and the high saturation magnetization layer is defined to be about at most 30 nm each which does not cause the appearance of the plural peaks. When the thickness of the magnetic layer is lower than 3 nm, then the magnetic film may be in an ultra-paramagnetic state in which the magnetization of the film may be disturbed by thermal fluctuation and the film could no more show ferromagnetism. Accordingly, the thickness of the magnetic layer is preferably about at least 3 nm.

Figure 11:
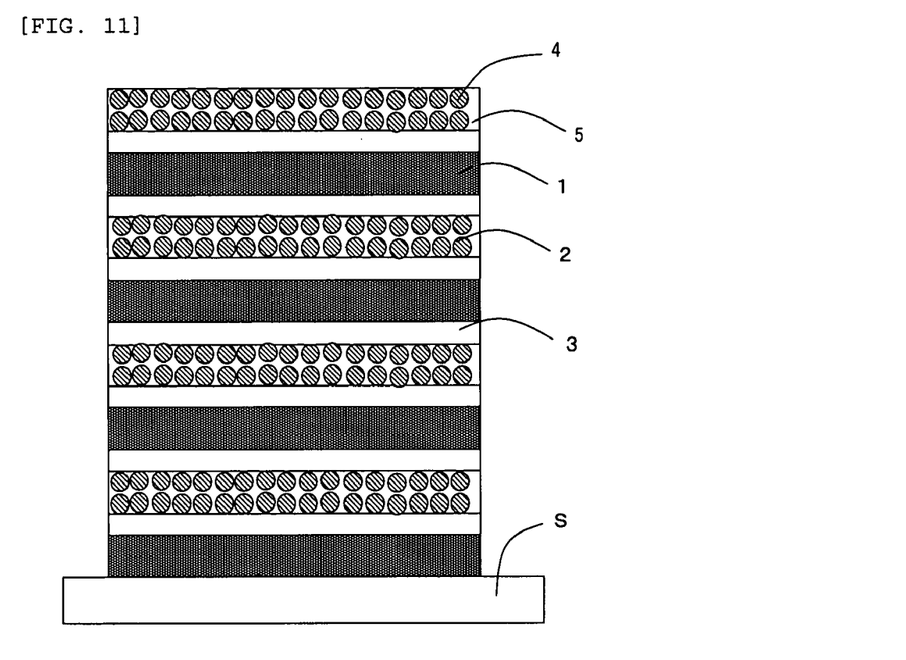
FIG. 11 is a schematic view showing the cross section of a magnetic thin film of a second embodiment of the invention.

The second embodiment of the high-frequency magnetic thin film is described with reference to FIG. 11 and FIG. 12. The magnetic thin film of FIG. 11 is a magnetic thin film laminate, in which the first magnetic layer 1 is a magnetic thin film formed of a Co—Sm alloy and the second magnetic layer 2 is a magnetic thin film having a granular structure that comprises magnetic particles 4 of an FeCo alloy enveloped with an insulator 5 of $SiO_2$.

Figure 12:
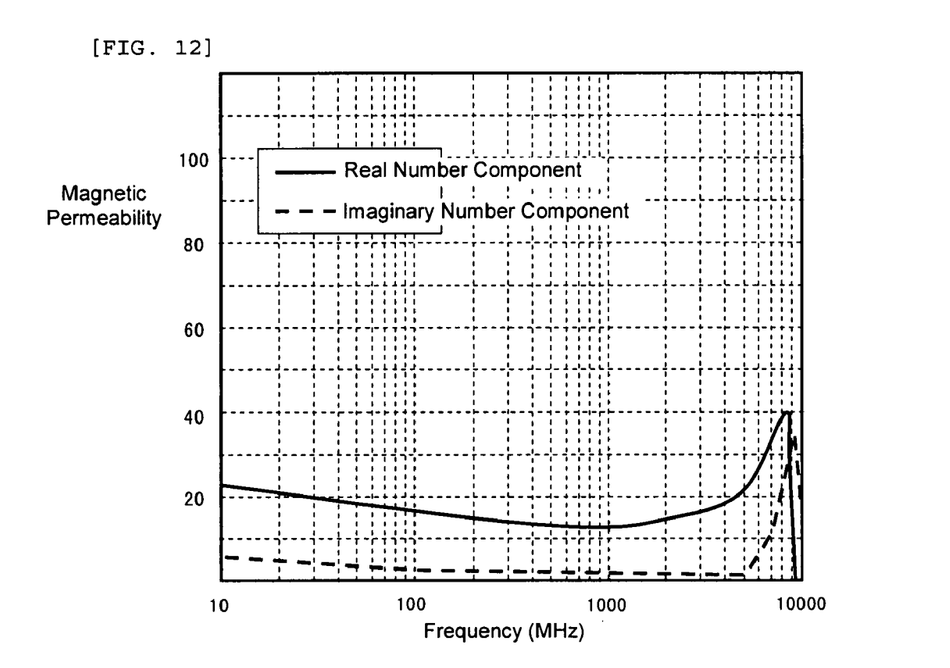
FIG. 12 is a magnetic permeability-frequency characteristic graph of the magnetic thin film of the second embodiment of the invention.

FIG. 12 shows a magnetic permeability-frequency characteristic graph of a sample of the magnetic thin film of the second embodiment, in which the first magnetic layer 1 is a Co—Sm layer having a thickness of about 10 nm, the second magnetic layer 2 is an FeCo (Fe: about 60 atm %)—$SiO_2$ granular layer having a thickness of about 20 nm, and the insulating layer 3 is an $SiO_2$ layer having a thickness of about 0.5 nm. The sample has a magnetic permeability of around 20 and a resonance frequency of about 9 GHz, therefore having excellent high-frequency magnetic characteristics. In this sample, the high saturation magnetization layer is a granular structure layer of an FeCo alloy; and the sample has such excellent magnetic characteristics like the other samples where the high saturation magnetization layer is a Co layer. It is understood that in this sample, the granular structure layer effectively functions as the high saturation magnetization layer therein.

Figure 13:
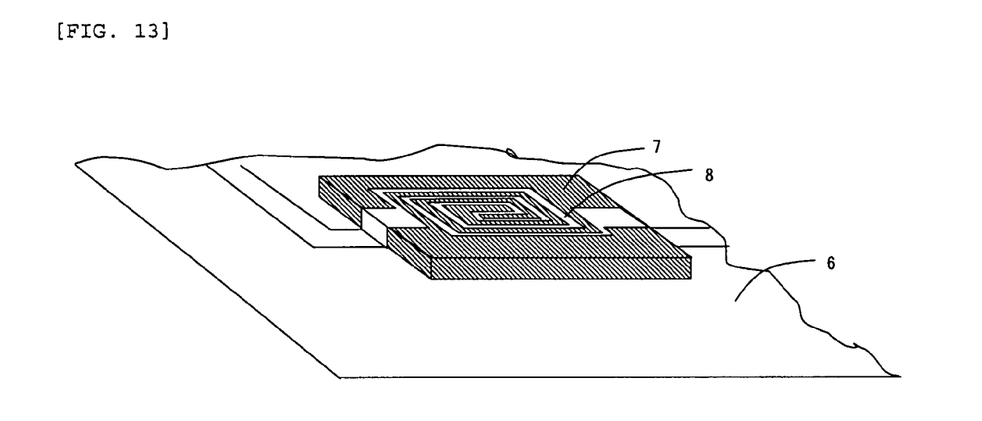
FIG. 13 is a perspective view showing one embodiment of an electronic device.

An embodiment of the electronic device is described with reference to FIG. 13. FIG. 13 shows an electronic device in which a magnetic thin film 7 is formed on a substrate 6 and a conductor 8 to constitute a plane coil is formed on the magnetic thin film 7. In this device, the magnetic thin film is used for the magnetic thin film 7, and the electronic device having the constitution is workable in a GHz-level band. This embodiment is an electronic device where a magnetic thin film is formed on a wiring board, but apart from it, the embodiment may also provide an electronic part to be fabricated by forming a magnetic thin film on an insulating substrate and processing it into individual chips.

While the invention has been described in detail and with reference to specific embodiments thereof, it will be apparent to one skilled in the art that the invention should not be limited to the above-mentioned embodiments but various changes and modifications can be made therein without departing from the spirit and scope of the invention.

These embodiments can be used in electronic parts comprising a thin film magnetic material such as thin-film inductors, thin-film transformers, etc. In particular, they can be utilized in circuit parts of electronic appliances to be used in a GHz-level band.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A magnetic thin film comprising a first magnetic layer and a second magnetic layer laminated to an insulating layer that intervenes between the first magnetic layer and the second magnetic layer, the first magnetic layer having a higher anisotropic magnetic field than the second magnetic layer, and the second magnetic layer having a higher saturation magnetization than the first magnetic layer, and wherein a resonance frequency of said film is in a frequency band of 1-10 GHz, wherein the first magnetic layer is made of a magnetic material selected from the group consisting of a Co—Sm alloy, a Co—Y alloy, a Co—Ce alloy, a Co—Pr alloy, a Co—La alloy, a Co-Nd alloy, a Fe—Pt alloy, and a Co—Pt alloy, and the second magnetic layer is made of a material selected from the group consisting of Co, Fe, an Fe—Co alloy, an Fe—Ni alloy, and a Co—Ni alloy.

2. The magnetic thin film as claimed in claim 1, wherein the first magnetic layer has a granular structure of a magnetic particle enveloped with an insulating material.

3. The magnetic thin film as claimed in claim 1, wherein the second magnetic layer has a granular structure of a magnetic particle enveloped with an insulating material.

4. The magnetic thin film as claimed in claim 1, wherein the first magnetic layer contains Sm.

5. The magnetic thin film as claimed in claim 1, wherein the alloy of the first magnetic layer contains Co.

6. The magnetic thin film as claimed in claim 1, wherein the alloy of the second magnetic layer contains Co.

7. The magnetic thin film as claimed in claim 1, wherein the first magnetic layer and the second magnetic layer are coupled in a mode of exchange coupling with each other via the insulating layer given therebetween.

8. The magnetic thin film as claimed in claim 1, wherein the first magnetic layer and the second magnetic layer are alternatively laminated via the insulating layer given therebetween.

9. The magnetic thin film as claimed in claim 1, wherein the thickness of the insulating layer is approximately from 0.2 to 1 nm.

10. The magnetic thin film as claimed in claim 1, wherein the thickness of the magnetic layer is approximately from 3 to 30 nm.

11. An electronic device comprising:
the magnetic thin film of claim 1; and
a conductor of a conductive metal having a predetermined shape formed on the magnetic thin film.

12. An electronic device comprising a current carrying conductor formed on a plurality of layers of different magnetic materials constituted by the magnetic thin film of claim 1.

13. The device of claim 12, wherein two magnetic materials are alternately laminated with insulating material therebetween.

14. The magnetic thin film as claimed in claim 1, wherein the resonance frequency is at least 3 GHz.

15. The magnetic thin film as claimed in claim 1, wherein the first magnetic layer is at least about 1000 Oe.

16. The magnetic thin film as claimed in claim 1, wherein the saturation magnetization is 1.25 T or more.

17. The device as claimed in claim 11, wherein the conductor shape forms a coil.

18. The device as claimed in claim 11, wherein the first magnetic layer contains Sm.

19. The device as claimed in claim 11, wherein at least one magnetic layer comprises Co.

20. The device as claimed in claim 11, wherein the first magnetic layer and the second magnetic layer are coupled in a mode of exchange coupling with each other via the insulating layer given therebetween.

21. The device as claimed in claim 11, wherein the thickness of the insulating layer is approximately from 0.2 to 1 nm.

22. The device as claimed in claim 11, wherein the thickness of the magnetic layer is approximately from 3 to 30 nm.

23. The device as claimed in claim 12, wherein the current carrying conductor is formed in the shape of a coil.

* * * * *